(12) United States Patent
Jong et al.

(10) Patent No.: US 11,848,243 B2
(45) Date of Patent: Dec. 19, 2023

(54) MOLDED SEMICONDUCTOR PACKAGE HAVING A SUBSTRATE WITH BEVELLED EDGE

(71) Applicant: Infineon Technologies Austria AG, Villach (AT)

(72) Inventors: Man Kyo Jong, Gyeongi-do (KR); Joon Seo Son, Seoul (KR)

(73) Assignee: Infineon Technologies Austria AG, Villach (AT)

(*) Notice: Subject to any disclaimer, the term of this patent is extended or adjusted under 35 U.S.C. 154(b) by 175 days.

(21) Appl. No.: 17/193,737

(22) Filed: Mar. 5, 2021

(65) Prior Publication Data

US 2022/0285239 A1    Sep. 8, 2022

(51) Int. Cl.
*H01L 23/31* (2006.01)
*H01L 21/56* (2006.01)
(Continued)

(52) U.S. Cl.
CPC ............ *H01L 23/31* (2013.01); *H01L 21/561* (2013.01); *H01L 21/565* (2013.01); *H01L 21/78* (2013.01); *H01L 23/49575* (2013.01)

(58) Field of Classification Search
CPC ..... H01L 23/31; H01L 21/561; H01L 21/565; H01L 21/78; H01L 23/49575; H01L 23/3735; H01L 23/4952; H01L 23/49562; H01L 2224/291; H01L 2224/32225; H01L 2224/32245; H01L 2224/45014; H01L 2224/48157; H01L 2224/48247;
(Continued)

(56) References Cited

U.S. PATENT DOCUMENTS 5,196,378 A    3/1993  Bean et al.
7,242,582 B2   7/2007  Kurauchi et al.
(Continued)

FOREIGN PATENT DOCUMENTS

DE    102013221954 A1   5/2014
DE    112015006064 T5   10/2017
JP    2010219385 A      9/2010

OTHER PUBLICATIONS

"Mitsubishi Electric DIPIPM+ Series Application Note PSSxxMC1Fx, PSSxxNC1Fx", Feb. 2020, pp. 1-55.

*Primary Examiner* — Thanh T Nguyen
(74) *Attorney, Agent, or Firm* — Murphy, Bilak & Homiller, PLLC

(57) ABSTRACT

A molded semiconductor package includes: semiconductor dies attached to a first side of a leadframe and electrically interconnected to form a power electronic circuit; a substrate attached to a second side of the leadframe opposite the first side, and including a metal body and electrically insulative material that separates the metal body from the leadframe; and a molding compound encapsulating the dies. The metal body includes a first surface in contact with the electrically insulative material, a second surface opposite the first surface and which is not covered by the molding compound, and a bevelled edge extending between the first and second surfaces. The bevelled edge of the metal body has a first sloped side face that extends from the first surface to an apex of the bevelled edge, and a second sloped side face that extends from the apex to the second surface. Methods of producing the package are also described.

16 Claims, 7 Drawing Sheets

(51) Int. Cl.
*H01L 21/78* (2006.01)
*H01L 23/495* (2006.01)

(58) Field of Classification Search
CPC . H01L 2224/73265; H01L 2924/15159; H01L 2924/1815; H01L 23/3142; H01L 23/4334; H01L 24/49; H01L 23/3107; H01L 25/072; H01L 21/56; H01L 23/3114; H01L 23/3121; H01L 23/3677; H01L 23/3736; H01L 23/49551; H01L 25/50

See application file for complete search history.

(56) References Cited

U.S. PATENT DOCUMENTS

| | | |
|---|---|---|
| 7,737,562 B2 | 6/2010 | Higaki et al. |
| 2003/0057573 A1 | 3/2003 | Sekine et al. |
| 2005/0067186 A1* | 3/2005 | Mizutani ............... H01L 21/565 |
| | | 174/253 |
| 2005/0176175 A1* | 8/2005 | Kanakubo ............. H01L 21/565 |
| | | 257/E25.031 |
| 2007/0187839 A1 | 8/2007 | Shim et al. |
| 2015/0371921 A1 | 12/2015 | Tanaka |

\* cited by examiner

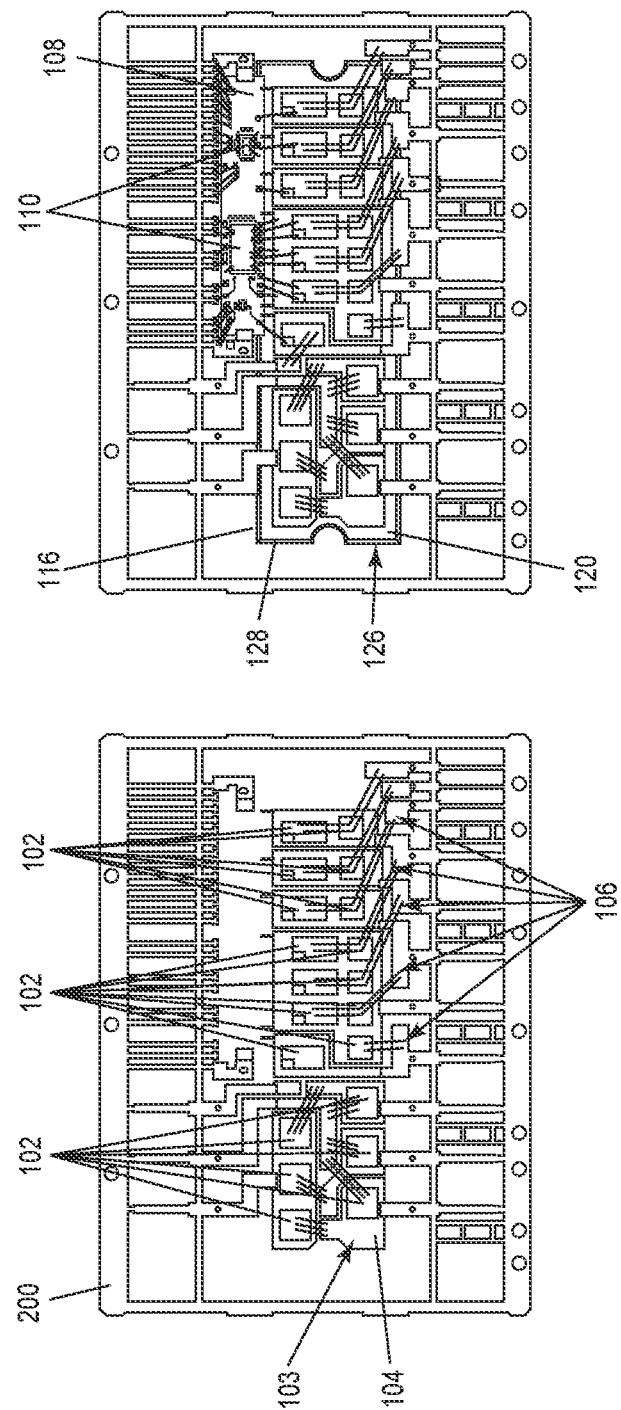
*Figure 2A*
*Figure 2B*
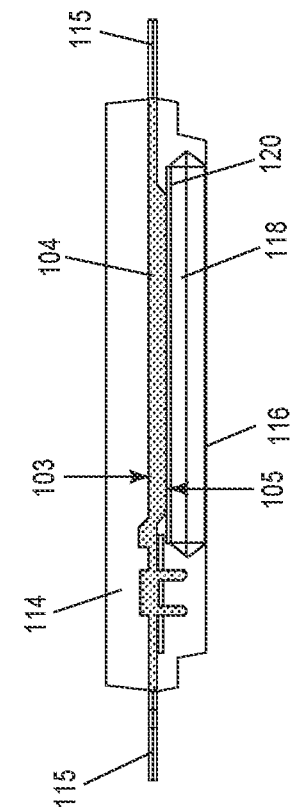
*Figure 2C*

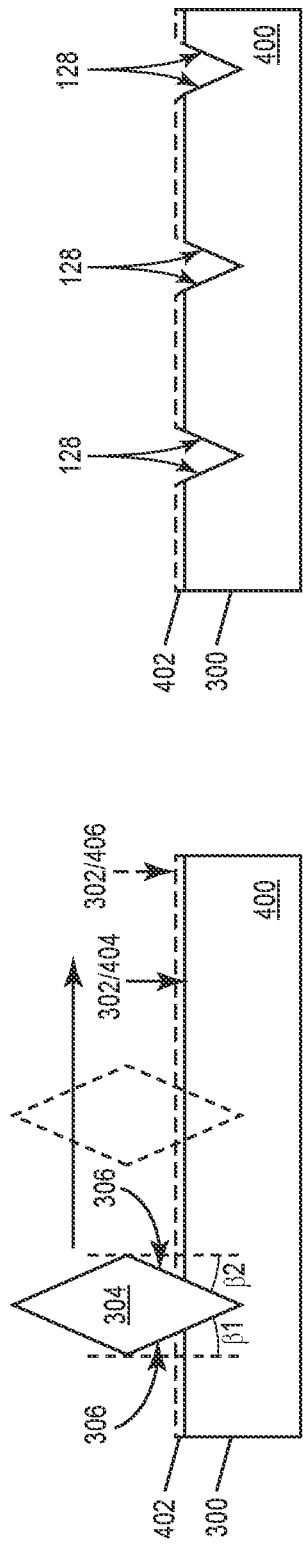
*Figure 4A*
*Figure 4B*
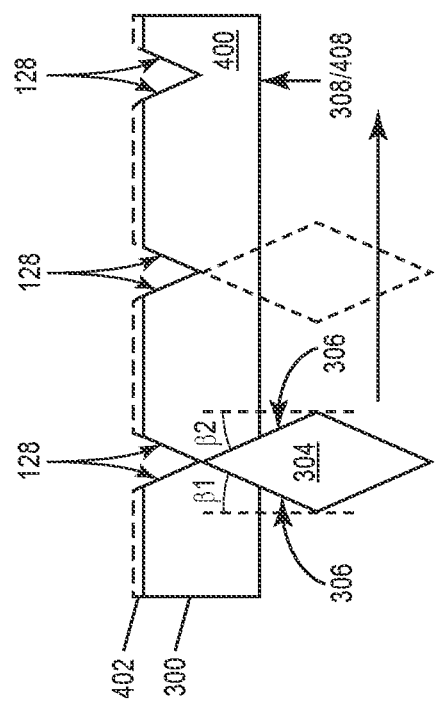
*Figure 4C*

MOLDED SEMICONDUCTOR PACKAGE HAVING A SUBSTRATE WITH BEVELLED EDGE

BACKGROUND

Molded semiconductor packages typically include a substrate for high heat dissipation under a leadframe and each semiconductor die (chip) included in the package. The substrate often includes an insulation layer on a metal layer such as copper or aluminum. The conventional edge shape of the substrate is vertically linear (straight line) or a vertical step shape with an additional cut.

A vertically linear edge shape is prone to separate from the molding compound that encapsulates each die included in the package, allowing humidity to penetrate through the delaminated area and which leads to reduced lifetime of the molded semiconductor package.

A vertical step shape at the substrate edge improves adherence between the substrate and molding compound, but increases the overall cost of the package by requiring an additional cutting process to make the vertical step shape during the manufacturing process.

Accordingly, there is a need for an improved substrate design for molded semiconductor packages.

SUMMARY

According to an embodiment of a molded semiconductor package, the molded semiconductor package comprises: a plurality of semiconductor dies attached to a first side of a leadframe and electrically interconnected to form a power electronic circuit; a substrate attached to a second side of the leadframe opposite the first side, the substrate comprising a metal body and an electrically insulative material that separates the metal body from the leadframe; and a molding compound encapsulating the plurality of semiconductor dies, wherein the metal body comprises: a first surface in contact with the electrically insulative material; a second surface opposite the first surface and which is not covered by the molding compound; and a bevelled edge that extends between the first surface and the second surface, wherein the bevelled edge of the metal body has a first sloped side face that extends from the first surface to an apex of the bevelled edge, and a second sloped side face that extends from the apex to the second surface.

According to an embodiment of a method of producing a molded semiconductor package, the method comprises: attaching a plurality of semiconductor dies to a first side of a leadframe; electrically interconnecting the plurality of semiconductor dies to form a power electronic circuit; attaching a substrate to a second side of the leadframe opposite the first side, the substrate comprising a metal body and an electrically insulative material that separates the metal body from the leadframe; and encapsulating the plurality of semiconductor dies in a molding compound, wherein the metal body comprises: a first surface in contact with the electrically insulative material; a second surface opposite the first surface and which is not covered by the molding compound; and a bevelled edge that extends between the first surface and the second surface, wherein the bevelled edge of the metal body has a first sloped side face that extends from the first surface to an apex of the bevelled edge, and a second sloped side face that extends from the apex to the second surface.

According to an embodiment of a method of batch producing molded semiconductor package substrates, the method comprises: forming an electrically insulative layer on a first main surface of a metal sheet; forming a plurality of intersecting V-shaped grooves in the first main surface of the metal sheet using a blade having sloped sidewalls; forming a plurality of intersecting V-shaped grooves in the second main surface of the metal sheet using the same or different blade having sloped sidewalls, the intersecting V-shaped grooves formed in the second main surface of the metal sheet being vertically aligned with the intersecting V-shaped grooves formed in the first main surface of the metal sheet; and singulating the molded semiconductor package substrates along the V-shaped grooves formed in the first main surface and the second main surface of the metal sheet such that each singulated molded semiconductor package substrate has a metal body and an electrically insulative material.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIGS. 2A through 2C illustrate an embodiment of a method of producing the molded semiconductor package shown in FIGS. 1A through 1D.

FIGS. 4A through 4C illustrate partial cross-sectional views of an embodiment of a method for producing the substrate used in the molded semiconductor packages shown in FIGS. 1A through 3B.

DETAILED DESCRIPTION

The embodiments described herein provide a molded semiconductor package having a heat dissipation substrate with a bevelled edge. The substrate with the bevelled edge is attached to a heat dissipation side of a leadframe, with semiconductor dies being attached to the opposite side of the leadframe. The bevelled edge of the substrate provides enhanced adherence between the substrate and a molding compound that encapsulates the dies as compared to a vertical linear edge, and offers higher thermal performance with larger exposed metal layer compared to a step cut edge shape.

Described next, with reference to the figures, are exemplary embodiments of the molded semiconductor package and related methods of production.

Figures 1A, 1B:
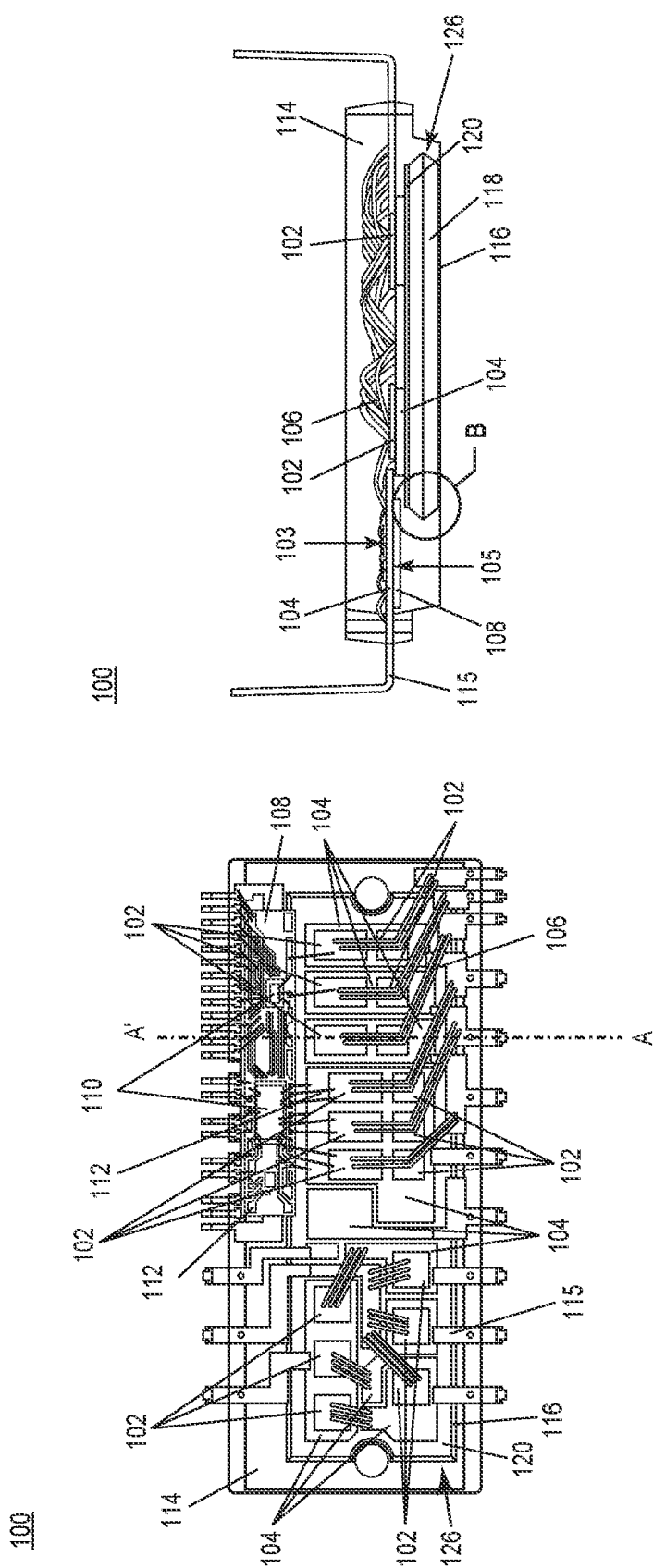
FIG. 1A illustrates a top plan view of a molded semiconductor package, according to an embodiment.
FIG. 1B illustrates a cross-sectional view of the molded semiconductor package taken along the line labelled A-A' in FIG. 1A.
Figure 1C:
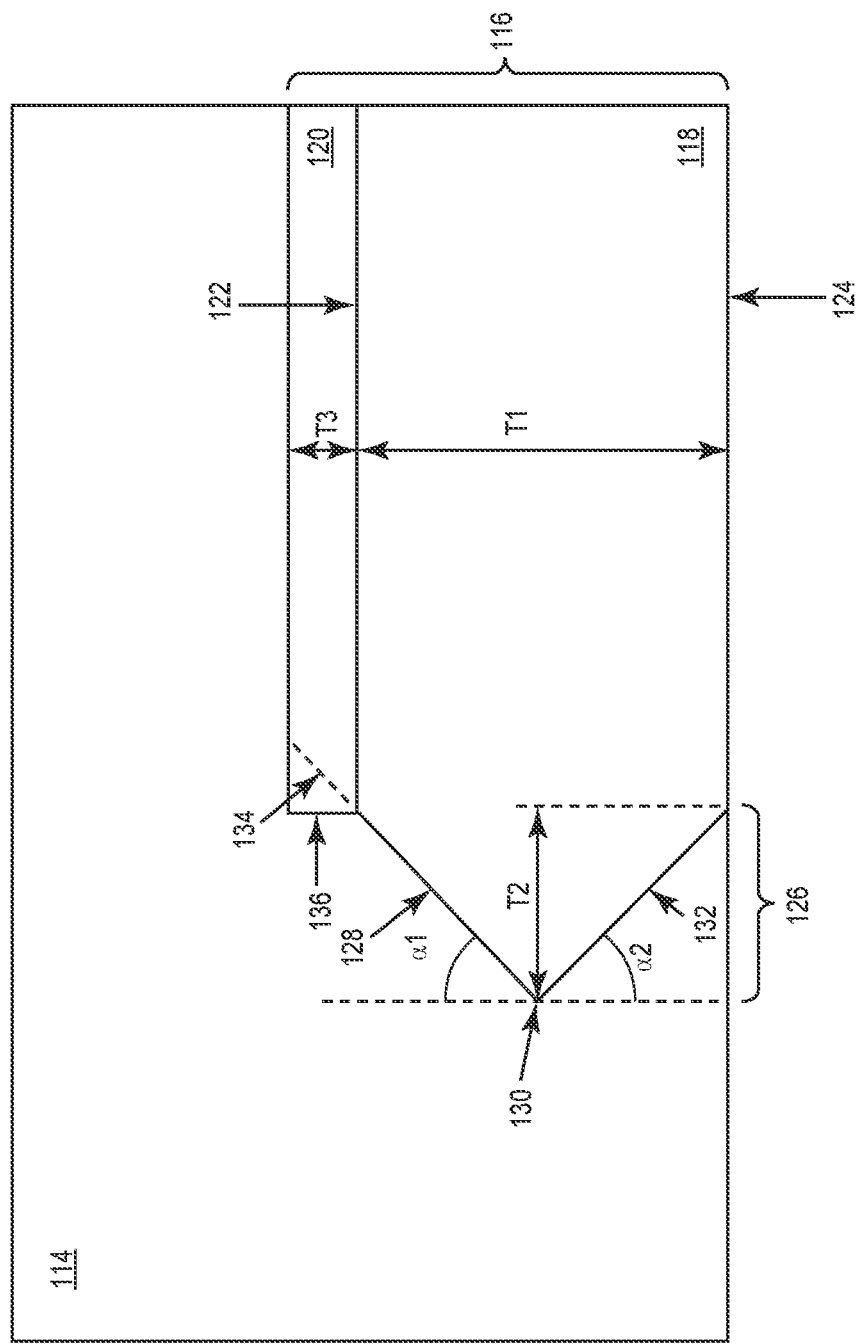
FIG. 1C illustrates an enlarged view of the region labelled B in FIG. 1B.

FIG. 1A illustrates a top plan view of a molded semiconductor package 100, according to an embodiment. FIG. 1B illustrates a cross-sectional view of the molded semiconductor package 100 taken along the line labelled A-A' in FIG. 1A. FIG. 1C illustrates an enlarged view of the region labelled B in FIG. 1B.

The molded semiconductor package 100 includes semiconductor dies 102 attached to a first side 103 of a leadframe 104. Each semiconductor die 102 may comprise any type of semiconductor material such as Si, SiC, GaN, etc. Each semiconductor die 102 may include a lateral or vertical power device such as a power transistor and/or a power diode. In the case of a lateral power device, all power and signal connections are made at the same side (e.g., facing side in FIG. 1A; top side in FIG. 1B) of the corresponding die 102. For example, in the case of a lateral GaN power HEMT (high-electron-mobility transistor), source, drain and gate connections may be made at the same side of the die corresponding die 102. In the case of a vertical power device, some power and possibly signal connections are made at one side (e.g., the non-facing side in FIG. 1A; bottom side in FIG. 1B) of the corresponding die 102. For example, in the case of a vertical power MOSFET (metal-oxide-semiconductor field-effect transistor) or vertical IGBT (insulated gate bipolar transistor), the source/emitter and gate connections may be made at one side and the drain/collector connection may be made at the opposite side of the corresponding die 102.

The semiconductor dies 102 are electrically interconnected to form a power electronic circuit such as a power converter, power inverter, B6 (3 half bridges), bridge rectifier, etc. The semiconductor dies 102 may be electrically interconnected to form the power electronic circuit by the leadframe 104 at the back side of the dies 102 (e.g., in the case of vertical devices) and/or by electrical conductors 106 such as wire bonds, wire ribbons, metal clips, etc. at the front side of the dies 102. Additional circuitry associated with operation of the power electronic circuit such as a microcontroller, driver circuitry, filters, etc. may be included in the molded semiconductor package 100, e.g., on a separate board 108 attached to the leadframe 104. The additional circuitry may include one or more semiconductor dies 110 and corresponding interconnects 112 such as metal traces on the board 108 and wire bonds, wire ribbons, metal clips, etc. for electrically interconnecting the one or more additional semiconductor dies 110 on the board 108 and/or electrically connecting the one or more additional semiconductor dies 110 to the semiconductor dies 102 separately attached to the leadframe 104.

A molding compound 114 encapsulates the semiconductor dies 102, 110. The molding compound 114 may comprise a wide variety of electrically insulating encapsulant materials including ceramics, epoxy materials and thermosetting plastics, to name a few. Leads 115 of the leadframe 104 may protrude through one or more side faces of the molding compound 114 to provide points of external electrical connection for the molded semiconductor package 100. The molding compound 114 above the leadframe 104 is not shown in FIG. 1A to provide an unobstructed view of other components of the molded semiconductor package 100.

The molded semiconductor package 100 also includes a substrate 116 attached to the side 105 of the leadframe 104 opposite the side 103 with the semiconductor dies 102. The substrate 116 includes a metal body 118 and an electrically insulative material 120 that separates the metal body 118 from the leadframe 104. The substrate 116 is thermally conductive and dissipates heat generated by the semiconductor dies 102 during operation, but the metal body 118 of the substrate 116 is electrically isolated from the semiconductor dies 102 by the electrically insulative material 120.

As shown in the enlarged view of FIG. 1C, the metal body 118 of the substrate 116 has a first surface 122 in contact with the electrically insulative material 120 of the substrate 116. The metal body 118 also has a second surface 124 opposite the first surface 122 and which is not covered by the molding compound 114. A bevelled edge 126 of the metal body 118 extends between the first surface 122 and the second surface 124. The bevelled edge 126 of the metal body 118 has a first sloped side face 128 that extends from the first surface 122 of the metal body 118 to an apex 130 of the bevelled edge 126, and a second sloped side face 132 that extends from the apex 130 of the bevelled edge 126 to the second surface 124 of the metal body 118.

Figure 1D:
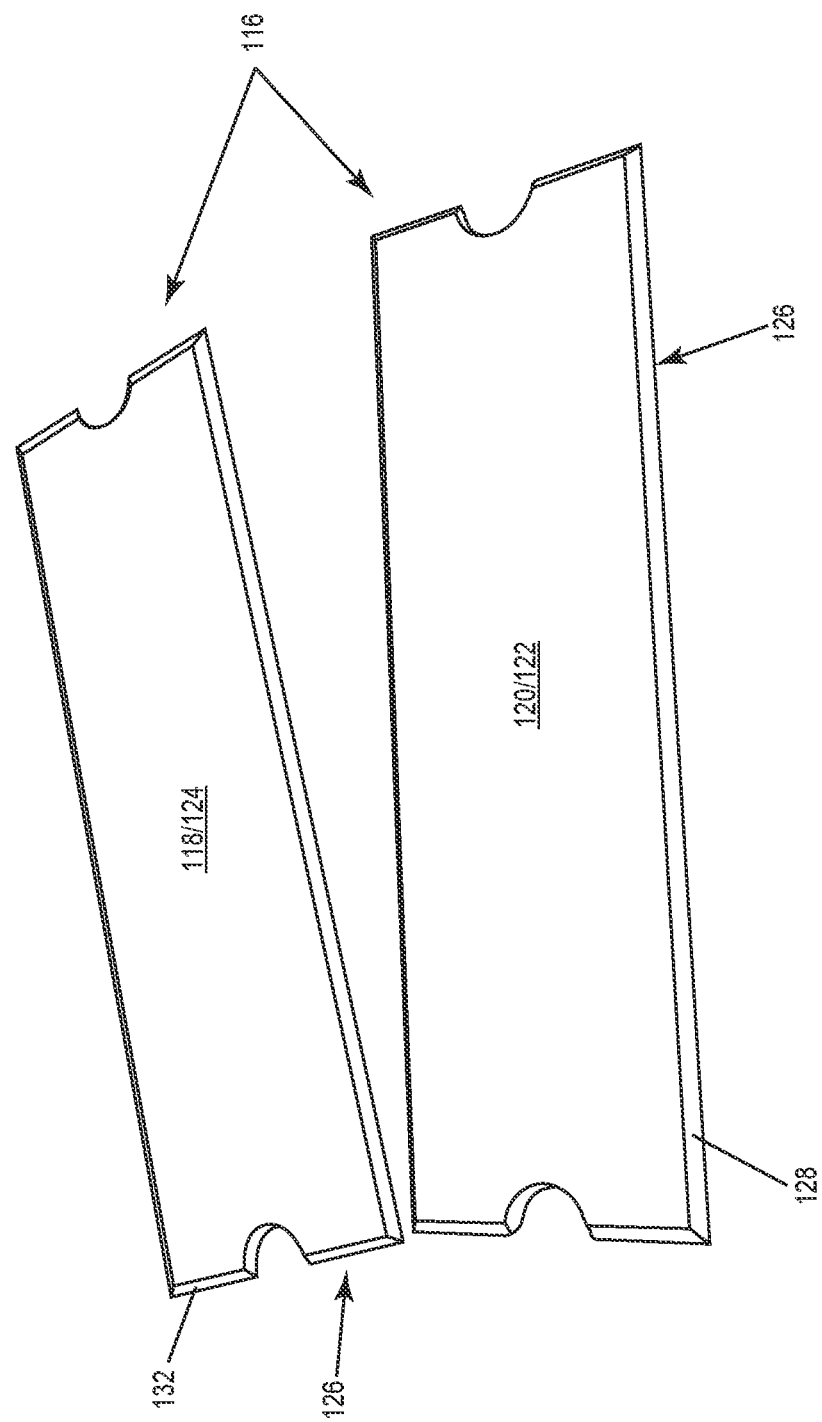
FIG. 1D illustrates a metallized side and an electrically insulating side of a substrate included in the molded semiconductor package.

FIG. 1D includes an upper view which shows the metallized side 124 of the substrate 116, and a lower view which shows the electrically insulating side 122 of the substrate 116. The first sloped side face 128 of the bevelled edge 126 is visible in the lower view of FIG. 1D whereas the second sloped side face 132 of the bevelled edge 126 is visible in the upper view of FIG. 1D.

In one embodiment, the molding compound 114 contacts both the first sloped side face 128 and the second sloped side face 132 of the metal body 118 of the substrate 116, e.g., as shown in FIG. 1C.

Separately or in combination, an angle α1 of the first sloped side face 128 of the metal body 118 of the substrate 116 as measured relative to a vertical projection from the apex 130 of the bevelled edge 126 may be in a range of 30 to 60 degrees.

Separately or in combination, an angle α2 of the second sloped side face 132 of the metal body 118 of the substrate 116 as measured relative to a vertical projection from the apex 130 of the bevelled edge 126 may be in a range of 30 to 60 degrees.

Separately or in combination, the first sloped side face 128 and the second sloped side face 132 of the metal body 118 of the substrate 116 may have the same slope (i.e., α1=α2 in FIG. 1C).

Separately or in combination, the metal body 118 of the substrate 116 may have a thickness 'T1' of 2 mm measured between the first and second surfaces 120, 124 of the metal body 118 and the bevelled edge 126 of the metal body 118 may have a thickness 'T2' in a range of 0.8 to 1.2 mm measured from the apex 130 inward. For T1=2 mm and T2=1 mm, α1=α2=45°. For the same T1 but a larger T2 (e.g., 1.2 mm), α1 and α2 decrease and the contact area between the molding compound 114 and the bevelled edge 126 of the substrate 116 increases which should further limit humidity penetration and increase reliability. For the same T1 but a smaller T2 (e.g., 0.8 mm), α1 and α2 increase and the contact area between the molding compound 114 and the bevelled edge 126 of the substrate 116 decreases. A range of 30 to 60 degrees (°) for α1 and α2 provides for reduced humidity penetration and increased reliability.

Separately or in combination, the electrically insulative material 120 of the substrate 116 may have a sloped side face 134 having the same angle α1 as the first sloped side face 128 of the metal body 118 of the substrate 116. The sloped side face 134 of the electrically insulative material 120 of the substrate 116 is shown as a dashed slanted line in FIG. 1C to indicate that the electrically insulative material 120 may instead have a vertical side face 136 in the bevelled edge region of the substrate 116.

Separately or in combination, the metal body 118 of the substrate 116 may be at least 10× thicker than the electrically insulative material 120 of the substrate 116 (i.e., T1≥10×T3 in FIG. 1C). For example, T1 may be 2 mm or greater and T3 may be less than 200 μm, e.g., 160 μm or less.

Separately or in combination, the electrically insulative material 120 of the substrate 116 may comprise one or more of $SiO_2$, $Al_2O_3$, AlN, BN, and resin. Still other electrically insulating and thermally conductive materials may be used for the electrically insulative material 120 of the substrate 116.

Separately or in combination, the metal body 118 of the substrate 116 may comprise Al, Cu or AlCu. Still other metal or metal alloys be used for the metal body 118 of the substrate 116.

FIGS. 2A through 2C illustrate an embodiment of a method of producing the molded semiconductor package 100 shown in FIGS. 1A through 1D.

FIG. 2A shows a plan view of the semiconductor dies 102 attached to a first side 103 of the leadframe 104. The semiconductor dies 102 may be attached to the leadframe 104 using any standard die attach material such as solder, glue, adhesive, etc. The die attach material may be applied to the leadframe 104, the semiconductor dies 102, or both. The die attach material is not visible in FIG. 2A.

The leadframe 104 may be part of a leadframe sheet 200 that includes multiple leadframes. In this case, more than one molded semiconductor package 100 may be produced concurrently. In FIG. 2A, at least some of the electrical connections 106 to the semiconductor dies 102 have been made, e.g., by wire bonding, ribbon bonding, clip bonding, etc.

FIG. 2B shows a plan view of the substrate 116 attached to the opposite side 105 of the leadframe 104 as the semiconductor dies 102. The substrate 116 may be attached to the leadframe 104 by bonding, gluing, adhering, soldering, etc. The electrically insulative material 120 of the substrate 116 electrically isolates the metal body 118 of the substrate 116 from the leadframe 104, as previously described herein. The electrically insulative material 120 of the substrate 116 faces upward in FIG. 2B.

Further in FIG. 2B, the remainder of the electrical connections 106 to the semiconductor dies 102 have been made, e.g., by wire bonding, ribbon bonding, clip bonding, etc. to form the desired power electronic circuit which may include the separate board 108 with the one or more additional semiconductor dies 110. The separate board 108 with the one or more additional semiconductor dies 110 may be attached to the leadframe 104 by bonding, gluing, adhering, soldering, etc. The one or more additional semiconductor dies 110 instead may be attached directly to the leadframe 104 and the separate board 1-8 may be omitted.

FIG. 2C shows a cross-sectional view of the semiconductor dies 102 encapsulated in the molding compound 114. The molding compound 114 may be formed by placing the package assembly in a three-dimensional chamber and injecting liquified encapsulant material into the chamber. Examples of such techniques include injection molding, transfer molding, compression molding, and film-assist molding. In another embodiment, the molding compound 114 may be formed by a lamination technique.

In the case of batch producing the molded semiconductor packages 100 using a leadframe sheet 200, the packages 100 may be separated/singulated from one another post molding by severing the leads 115 and leadframe 104 of each molded semiconductor package 100 from the leadframe sheet 200. For example, the leadframe sheet 200 may be stamped, punched, cut, etched, etc. in regions outside the molding compound 114 to singulate the packages 100.

Figure 3B:
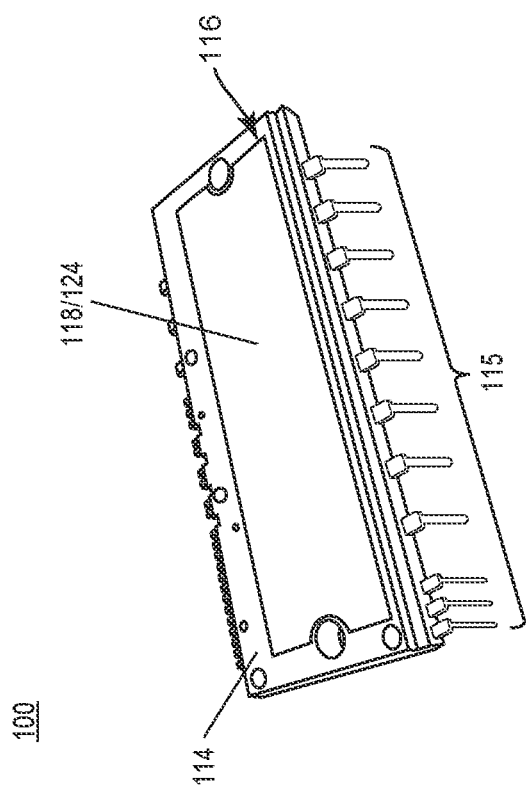
FIG. 3B shows a top perspective view of the molded semiconductor package shown in FIG. 3A.
Figure 3A:
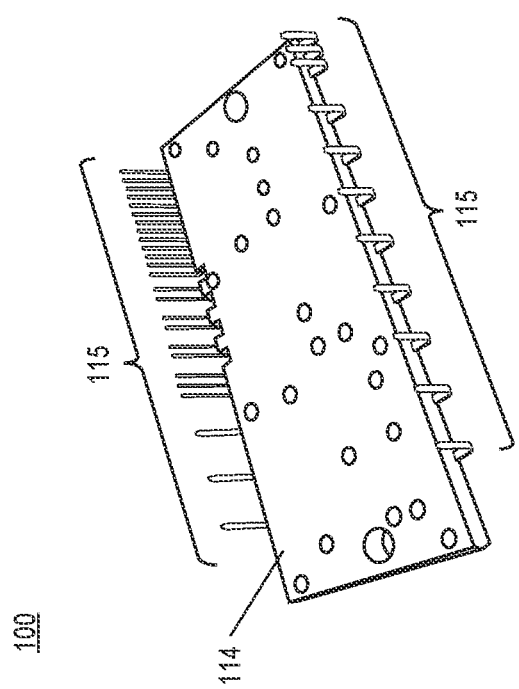
FIG. 3A shows a bottom perspective view of a molded semiconductor package produced in accordance with the method illustrated in FIGS. 2A through 2C, according to an embodiment.

FIG. 3A shows a bottom perspective view of a molded semiconductor package 100 produced in accordance with the method illustrated in FIGS. 2A through 2C, according to an embodiment. FIG. 3B shows a top perspective view of the molded semiconductor package 100. Other lead types and configurations may be used. In each case, the second surface 124 of the metal body 118 of the substrate 116 is not covered by the molding compound 114. The exposed surface 124 of the metal body 118 provides an enhanced heat dissipation path at this side of the molded semiconductor package 100.

FIGS. 4A through 4C illustrate partial cross-sectional views of an embodiment of a method for producing the substrate 116 used in the molded semiconductor packages 100 illustrated in FIGS. 1A through 3B. Prior to attaching the substrate 116 to the leadframe 104, the substrate 116 is singulated from a substrate sheet 300. The substrate sheet 300 is used to concurrently produce a plurality of substrates 116 and comprises a metal or metal alloy such as Al, Cu, AlCu, etc.

FIG. 4A shows cutting a first main surface 302 of the substrate sheet 300 in multiple locations with a blade 304 having sloped sidewalls 306 to form the first sloped side face 128 of each substrate 116. In one embodiment, the sloped sidewalls 306 of the blade 304 are angled (β1, β2) in a range of 30 to 60 degrees.

FIG. 4B shows the substrate sheet 300 after all cuts are made in the first main surface 302 of the substrate sheet 300.

FIG. 4C shows cutting a second main surface 308 of the substrate sheet 300 in multiple locations with a blade 304 having sloped sidewalls 306 to form the second sloped side face 132 of each substrate 116. In one embodiment, the sloped sidewalls 306 of the blade 304 used to cut the second main surface 308 of the substrate sheet 300 are angled (β1, β2) in a range of 30 to 60 degrees.

The same or different blade 304 may be used to cut the first and second main surfaces 302, 308 of the substrate sheet 300. In the case of the same blade 304 being used, the first and second sloped side faces 128, 132 of each substrate 116 have the same angle (α1=α2=β1=β2). If different blades 304 are used to cut the first and second main surfaces 302, 308 of the substrate sheet 300, the first and second sloped side faces 128, 132 of each substrate 116 may have different angles if the sidewalls slopes for the blades 304 are different (e.g., α1=α2≠β1=β2).

The electrically insulative material 120 of each substrate 116 may be formed on the metal body 118 of each substrate before or after the first main surface 302 of the substrate sheet 300 is cut. Accordingly, the electrically insulative material 120 of each substrate 116 may or may not have the same sloped sidewall as the metal body 118 depending on when the electrically insulative material 120 is formed.

In one embodiment, the substrate sheet 300 is a composite sheet at the time of cutting and comprises a metal layer 400 and an electrically insulative layer 402 formed on a first main surface 404 of the metal layer 400. According to this embodiment, the first main surface 302 of the substrate sheet 300 corresponds to the main surface 406 of the electrically insulative layer 402 which faces away from the metal layer 400 as indicated by the vertical dashed arrow in FIG. 4A.

In another embodiment, the substrate sheet 300 is cut as a metal layer 400 without the electrically insulative layer 402 formed thereon. According to this embodiment, the first main surface 302 of the substrate sheet 300 corresponds to the first main surface 404 of the metal layer 400 as indicated by the vertical solid arrow in FIG. 4A. In either case, the second main surface 308 of the substrate sheet 300 corresponds to the second main surface 408 of the metal layer 400 as indicated by the vertical solid arrow in FIG. 4C.

Figure 5B:
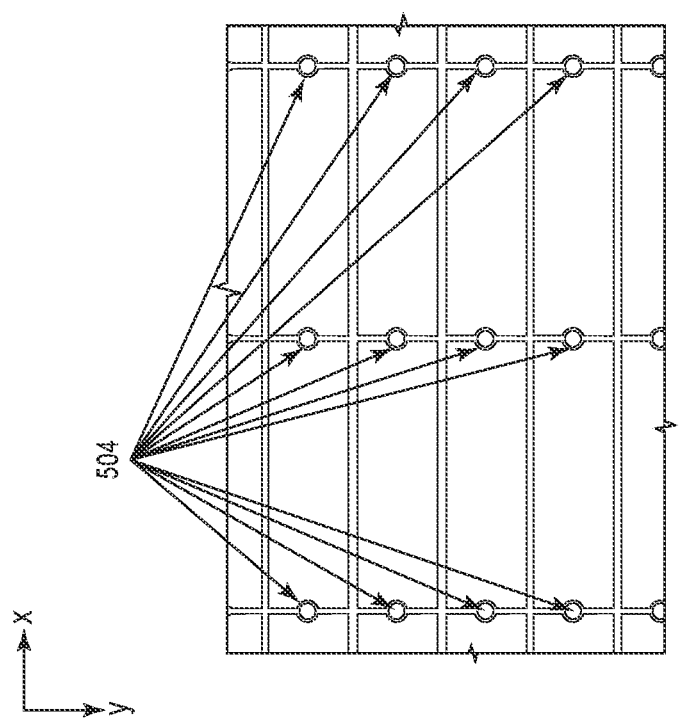
FIGS. 5A through 5C illustrate partial top plan views of a substrate sheet used to produce the package substrates shown in FIGS. 1A through 4C, during different stages of production.
Figure 5A:
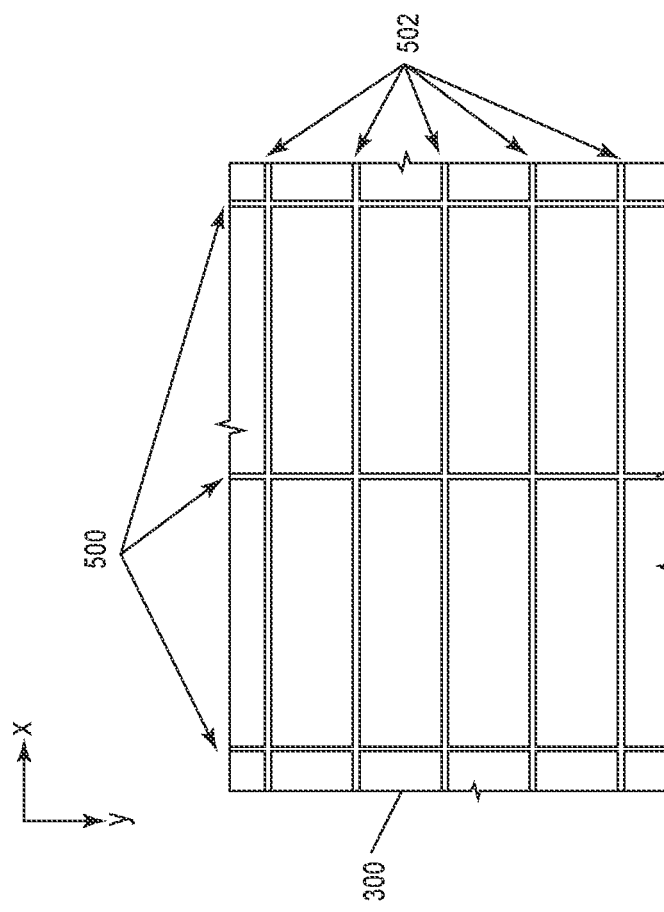
Figure 5C:
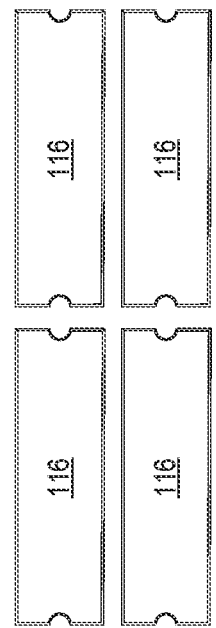

FIGS. 5A through 5C illustrate partial top plan views of the substrate sheet 300 during different stages of production. The electrically insulative layer 402 shown in FIGS. 4A through 4C may be formed on the first main surface 404 of the metal layer 400 before or after cutting of the substrate sheet 300, as explained above.

FIG. 5A shows intersecting V-shaped grooves 500, 502 formed in the first main surface 404 of the metal layer 400 using the blade 304 with sloped sidewalls 306. If the electrically insulative layer 402 is formed on the first main surface 404 of the metal layer 400 before cutting of the substrate sheet 300, the intersecting V-shaped grooves 500, 502 are also formed in the electrically insulative layer 402 at the same angle as formed in the first main surface 404 of the metal layer 400. The angle of the intersecting V-shaped grooves 500, 502 corresponds to the angle β1, β2 of the sidewalls 306 of the blade 304 used to form the V-shaped grooves 500, 502 in the first main surface 404 of the metal layer 400, e.g., as shown in FIG. 4A.

Corresponding intersecting V-shaped grooves are formed in the second main surface 408 of the metal layer 400 using the same or different blade 304 with sloped sidewalls 306. For example, the metal layer 400 may be cut halfway through from the first main surface 404, then the substrate sheet 300 is flipped and the cutting continues from the second main surface 408 of the metal layer 400. This approach results in the apex 130 of each bevelled edge 126 being approximately centered along the horizontal center line of each substrate 116. The apex 130 of each bevelled edge 126 instead may be formed off-centered with respect to the horizontal center line by cutting deeper into one of the main surfaces 404/408 of the substrate sheet 300 than the other surface 408/404.

The intersecting V-shaped grooves formed in the second main surface 408 of the metal layer 400 are out of view in FIG. 5A, but are vertically aligned with the intersecting V-shaped grooves 500, 502 formed in the first main surface 404 of the metal layer 400, e.g., as shown in FIG. 4C. The V-shaped grooves may be formed in both main surfaces 404, 408 of the metal layer 400 by moving the same or different blade 304 with the same or different cutting angle in the x and y directions indicated in FIG. 5A.

FIG. 5B shows openings 504 formed in the substrate sheet 300. The openings 504 may be used for alignment and/or fixing of the substrates 116 during subsequent processing, e.g., during molding. The openings 504 may be formed by punching, etching, laser drilling, mechanical drilling, etc.

FIG. 5C shows individual substrates 116 formed from the substrate sheet 300. The substrate sheet 300 may be stamped, punched, etched, cut, etc. to singulate the substrates 116. The substrates 116 are singulated along the vertically aligned V-shaped grooves formed in the opposing main surfaces 404, 408 of the metal layer 400.

Alternatively, the substrate sheet 300 may be processed with the leadframe sheet 200 shown in FIGS. 2A through 2D with the substrates 116 singulated from the substrate sheet 300 post molding. For example, the substrates 116 and leadframes 104 may be singulated using the same process, e.g., stamping, punching, etching, cutting, etc. post molding. In each case, the singulated substrates 116 each have the metal body 118, electrically insulative material 120 and bevelled edge 126 previously described herein.

Although the present disclosure is not so limited, the following numbered examples demonstrate one or more aspects of the disclosure.

Example 1. A molded semiconductor package, comprising: a plurality of semiconductor dies attached to a first side of a leadframe and electrically interconnected to form a power electronic circuit; a substrate attached to a second side of the leadframe opposite the first side, the substrate comprising a metal body and an electrically insulative material that separates the metal body from the leadframe; and a molding compound encapsulating the plurality of semiconductor dies, wherein the metal body comprises: a first surface in contact with the electrically insulative material; a second surface opposite the first surface and which is not covered by the molding compound; and a bevelled edge that extends between the first surface and the second surface, wherein the bevelled edge of the metal body has a first sloped side face that extends from the first surface to an apex of the bevelled edge, and a second sloped side face that extends from the apex to the second surface.

Example 2. The molded semiconductor package of example 1, wherein the molding compound contacts both the first sloped side face and the second sloped side face of the metal body.

Example 3. The molded semiconductor package of example 1 or 2, wherein an angle of the first sloped side face of the metal body as measured relative to a vertical projection from the apex of the bevelled edge is in a range of 30 to 60 degrees.

Example 4. The molded semiconductor package of any of examples 1 through 3, wherein an angle of the second sloped side face of the metal body as measured relative to a vertical projection from the apex of the bevelled edge is in a range of 30 to 60 degrees.

Example 5. The molded semiconductor package of any of examples 1 through 4, wherein the first sloped side face and the second sloped side face of the metal body have the same slope.

Example 6. The molded semiconductor package of any of examples 1 through 5, wherein the metal body has a thickness of 2 mm measured between the first surface and the second surface, and wherein the bevelled edge of the metal body has a thickness in a range of 0.8 to 1.2 mm measured from the apex inward.

Example 7. The molded semiconductor package of any of examples 1 through 6, wherein the electrically insulative material has a sloped side face having the same angle as the first sloped side face of the metal body.

Example 8. The molded semiconductor package of any of examples 1 through 7, wherein the metal body is at least 10× thicker than the electrically insulative material.

Example 9. The molded semiconductor package of any of examples 1 through 8, wherein the electrically insulative material comprises one or more of SiO2, Al2O3, AlN, BN, and resin.

Example 10. The molded semiconductor package of any of examples 1 through 9, wherein the metal body comprises Al, Cu or AlCu.

Example 11. A method of producing a molded semiconductor package, the method comprising: attaching a plurality of semiconductor dies to a first side of a leadframe; electrically interconnecting the plurality of semiconductor dies to form a power electronic circuit; attaching a substrate to a second side of the leadframe opposite the first side, the substrate comprising a metal body and an electrically insulative material that separates the metal body from the leadframe; and encapsulating the plurality of semiconductor dies in a molding compound, wherein the metal body comprises: a first surface in contact with the electrically insulative material; a second surface opposite the first surface and which is not covered by the molding compound; and a bevelled edge that extends between the first surface and the second surface, wherein the bevelled edge of the metal body has a first sloped side face that extends from the first surface to an apex of the bevelled edge, and a second sloped side face that extends from the apex to the second surface.

Example 12. The method of example 11, further comprising: prior to attaching the substrate to the second side of the leadframe, singulating the substrate from a substrate sheet.

Example 13. The method of example 12, further comprising: prior to singulating the substrate from the substrate sheet, cutting a first main surface of the substrate sheet with a blade having sloped sidewalls to form the first sloped side face of the substrate, and cutting a second main surface of the substrate sheet opposite the first main surface with the same or different blade having sloped sidewalls to form the second sloped side face of the substrate.

Example 14. The method of example 13, wherein the sloped sidewalls of each blade used to cut the substrate sheet are angled in a range of 30 to 60 degrees.

Example 15. A method of batch producing molded semiconductor package substrates, the method comprising: forming an electrically insulative layer on a first main surface of a metal sheet; forming a plurality of intersecting V-shaped grooves in the first main surface of the metal sheet using a blade having sloped sidewalls; forming a plurality of intersecting V-shaped grooves in the second main surface of the metal sheet using the same or different blade having sloped sidewalls, the intersecting V-shaped grooves formed in the second main surface of the metal sheet being vertically aligned with the intersecting V-shaped grooves formed in the first main surface of the metal sheet; and singulating the molded semiconductor package substrates along the V-shaped grooves formed in the first main surface and the second main surface of the metal sheet such that each singulated molded semiconductor package substrate has a metal body and an electrically insulative material.

The method of example 15, wherein: the metal body of each molded semiconductor package substrate comprises: a first surface in contact with the electrically insulative material; a second surface opposite the first surface; and a bevelled edge that extends between the first surface and the second surface; the bevelled edge of each metal body has a first sloped side face that extends from the first surface of the metal body to an apex of the bevelled edge, and a second sloped side face that extends from the apex to the second surface of the metal body; an angle of the first sloped side face of each metal body corresponds to the angle of the sidewalls of the blade used to form the V-shaped grooves in the first main surface of the metal sheet; and an angle of the second sloped side face of each metal body corresponds to the angle of the sidewalls of the blade used to form the V-shaped grooves in the second main surface of the metal sheet.

Example 17. The method of example 16, wherein the angle of the sloped sidewalls of the blade used to form the V-shaped grooves in the first main surface of the metal sheet is in a range of 30 to 60 degrees.

Example 18. The method of example 16 or 17, wherein the angle of the sloped sidewalls of the blade used to form the V-shaped grooves in the second main surface of the metal sheet is in a range of 30 to 60 degrees.

Example 19. The method of any of example 16 through 18, wherein: the electrically insulative layer is formed on the first main surface of the metal sheet before the V-shaped grooves are formed in the first main surface of the metal sheet; the electrically insulative material of each molded semiconductor package substrate has a sloped side face having the same angle as the first sloped side face of the metal body of the molded semiconductor package substrate; and an angle of the sloped side face of the electrically insulative material of each molded semiconductor package substrate corresponds to the angle of the sidewalls of the blade used to form the V-shaped grooves in the first main surface of the metal sheet.

Example 20. The method of any of examples 15 through 19, wherein the same blade is used to form the V-shaped grooves in the both the first main surface and the second main surface of the metal sheet.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A molded semiconductor package, comprising:
a plurality of semiconductor dies attached to a first side of a leadframe and electrically interconnected to form a power electronic circuit;
a substrate attached to a second side of the leadframe opposite the first side, the substrate comprising a metal body and an electrically insulative material that separates the metal body from the leadframe; and
a molding compound encapsulating the plurality of semiconductor dies,
wherein the metal body comprises:
a first surface in contact with the electrically insulative material;
a second surface opposite the first surface and which is not covered by the molding compound; and
a bevelled edge that extends between the first surface and the second surface,
wherein the bevelled edge of the metal body has a first sloped side face that extends from the first surface to an apex of the bevelled edge, and a second sloped side face that extends from the apex to the second surface.

2. The molded semiconductor package of claim 1, wherein the molding compound contacts both the first sloped side face and the second sloped side face of the metal body.

3. The molded semiconductor package of claim 1, wherein an angle of the first sloped side face of the metal body as measured relative to a vertical projection from the apex of the bevelled edge is in a range of 30 to 60 degrees.

4. The molded semiconductor package of claim 1, wherein an angle of the second sloped side face of the metal body as measured relative to a vertical projection from the apex of the bevelled edge is in a range of 30 to 60 degrees.

5. The molded semiconductor package of claim 1, wherein the first sloped side face and the second sloped side face of the metal body have the same slope.

6. The molded semiconductor package of claim 1, wherein the metal body has a thickness of 2 mm measured between the first surface and the second surface, and wherein the bevelled edge of the metal body has a thickness in a range of 0.8 to 1.2 mm measured from the apex inward.

7. The molded semiconductor package of claim 1, wherein the electrically insulative material has a sloped side face having the same angle as the first sloped side face of the metal body.

8. The molded semiconductor package of claim 1, wherein the metal body is at least 10× thicker than the electrically insulative material.

9. The molded semiconductor package of claim 1, wherein the electrically insulative material comprises one or more of $SiO_2$, $Al_2O_3$, AlN, BN, and resin.

10. The molded semiconductor package of claim 1, wherein the metal body comprises Al, Cu or AlCu.

11. The molded semiconductor package of claim 1, further comprising:
    a separate board attached to the leadframe; and
    additional circuitry associated with operation of the power electronic circuit on the separate board.

12. The molded semiconductor package of claim 11, wherein the additional circuitry comprises one or more additional semiconductor dies and interconnects that electrically interconnect the one or more additional semiconductor dies on the separate board and/or electrically connect the one or more additional semiconductor dies on the separate board to the plurality of semiconductor dies separately attached to the first side of the leadframe.

13. The molded semiconductor package of claim 12, wherein the interconnects comprise metal traces on the separate board that electrically interconnect the one or more additional semiconductor dies on the separate board.

14. The molded semiconductor package of claim 12, wherein the interconnects comprise wire bonds, wire ribbons, and/or metal clips that electrically connect the one or more additional semiconductor dies on the separate board to the plurality of semiconductor dies separately attached to the first side of the leadframe.

15. The molded semiconductor package of claim 11, wherein the additional circuitry comprises a microcontroller and/or driver circuitry.

16. The molded semiconductor package of claim 1, wherein the substrate has a shape of an oblong rectangle, and wherein the substrate has a rounded indentation formed in opposite short sides of the oblong rectangle.

* * * * *